(12) United States Patent
Zimmerman et al.

(10) Patent No.: US 8,410,511 B2
(45) Date of Patent: Apr. 2, 2013

(54) METHODS FOR HIGH TEMPERATURE PROCESSING OF EPITAXIAL CHIPS

(75) Inventors: Scott M. Zimmerman, Basking Ridge, NJ (US); Karl W. Beeson, Princeton, NJ (US); William R. Livesay, San Diego, CA (US)

(73) Assignee: Goldeneye, Inc., San Diego, CA (US)

( * ) Notice: Subject to any disclaimer, the term of this patent is extended or adjusted under 35 U.S.C. 154(b) by 437 days.

(21) Appl. No.: 12/589,056

(22) Filed: Oct. 16, 2009

(65) Prior Publication Data

US 2010/0264452 A1 Oct. 21, 2010

Related U.S. Application Data

(60) Provisional application No. 61/196,439, filed on Oct. 17, 2008.

(51) Int. Cl.
*H01L 29/22* (2006.01)
*H01L 21/20* (2006.01)

(52) U.S. Cl. ... 257/99; 257/434; 257/615; 257/E21.108; 257/E29.1; 438/478; 438/507

(58) Field of Classification Search .......... 257/99, 257/434, 615, E21.09, E21.108, E29.1, E33.025, 257/E33.028; 438/478, 507, 509
See application file for complete search history.

(56) References Cited

U.S. PATENT DOCUMENTS

| | | | |
|---|---|---|---|
| 4,136,435 A | 1/1979 | Li | |
| 4,195,226 A * | 3/1980 | Robbins et al. | 250/363.01 |
| 4,445,132 A | 4/1984 | Ichikawa et al. | |
| 4,456,490 A | 6/1984 | Dutta et al. | |
| 5,585,640 A * | 12/1996 | Huston et al. | 250/483.1 |
| 6,087,680 A | 7/2000 | Graman et al. | |
| 6,683,416 B1 | 1/2004 | Oohata et al. | |
| 7,224,587 B2 * | 5/2007 | Dittus et al. | 361/719 |
| 7,453,092 B2 * | 11/2008 | Suehiro et al. | 257/79 |
| 7,777,250 B2 * | 8/2010 | Lochtefeld | 257/190 |
| 2002/0063256 A1 * | 5/2002 | Lin | 257/79 |
| 2006/0255341 A1 * | 11/2006 | Pinnington et al. | 257/79 |
| 2006/0280668 A1 * | 12/2006 | Dmitriev et al. | 423/412 |
| 2008/0182353 A1 | 7/2008 | Zimmerman et al. | |
| 2008/0258165 A1 | 10/2008 | Zimmerman et al. | |
| 2009/0001390 A1 * | 1/2009 | Yan et al. | 257/89 |
| 2009/0159126 A1 * | 6/2009 | Chan | 136/259 |
| 2010/0295090 A1 * | 11/2010 | Craford et al. | 257/99 |

* cited by examiner

*Primary Examiner* — Tuan N. Quach
(74) *Attorney, Agent, or Firm* — William Propp, Esq.

(57) ABSTRACT

High temperature semiconducting materials in a freestanding epitaxial chip enables the use of high temperature interconnect and bonding materials. Process materials can be used which cure, fire, braze, or melt at temperatures greater than 400 degrees C. These include, but are not limited to, brazing alloys, laser welding, high-temperature ceramics and glasses. High temperature interconnect and bonding materials can additionally exhibit an index of refraction intermediate to that of the freestanding epitaxial chip and its surrounding matrix. High index, low melting point glasses provide a hermetic seal of the semiconductor device and also index match the freestanding epitaxial chip thereby increasing extraction efficiency. In this manner, a variety of organic free semiconducting devices, such as solid-sate lighting sources, can be created which exhibit superior life, efficiency, and environmental stability.

6 Claims, 8 Drawing Sheets

METHODS FOR HIGH TEMPERATURE PROCESSING OF EPITAXIAL CHIPS

REFERENCE TO PRIOR APPLICATION

This application claims the benefit of U.S. Provisional Patent Application Ser. No. 61/196,439, which was filed on Oct. 17, 2008, which is herein incorporated by reference.

BACKGROUND OF THE INVENTION

High power semiconducting devices including, but not limited to, LEDs, laser diodes, HEMTs, solar cells, photo-electrochemical cells, and RF devices, are becoming increasingly important. While silicon has typically dominated many of these markets, increasingly nitrides, carbides, and oxides are becoming important electronic materials based on their superior properties. Nitrides have become the material of choice for LEDs and they are also rapidly expanding into high frequency and power devices. Silicon carbide and ZnO also are becoming important electronic materials.

In many cases the use of transfer techniques such as wafer-bonding are required for high power semiconducting devices using nitride, carbide and oxide epitaxial layers due to the lack of native substrates. Thin epitaxial layers are transferred onto a variety of substrates ranging from silicon to metal composites. Typically, a solder layer is used to bond the thin epitaxial layer to the underlying support substrate.

Methods and articles based on thick epitaxial layers, which do not require an underlying support substrate, can be formed inexpensively based on HVPE templates, such as co-pending U.S. patent application Ser. Nos. 12/221,304; 12/462,295; and 12/583,527, commonly assigned as the present application and herein incorporated by reference. These large area freestanding epitaxial chips are formed by a novel laser liftoff process, which does not crack the epitaxial layer even without wafer bonding steps. Using this approach, 30 micron thick epitaxial chips with sizes greater than 1 inch square have been formed. These large area freestanding epitaxial chips are potentially less expensive to manufacture than the more conventional prior art method of using large wafers bonded to non-native substrates with epitaxial growth followed by dicing and polishing. The freestanding epitaxial chips also exhibit reduced stresses, don't require polishing steps, which induce defects, and are flexible. In particular it has been disclosed that the emission spectra of devices grown on these large area freestanding epitaxial chips exhibit wider bandwidth and unique spectra from devices fabricated with the growth substrate attached in wafer form or on diced substrates. This appears to be due to the removal of stresses formed during the growth process.

It has been found that the flexible nature and nitride only nature of the freestanding epitaxial chip enables the use of high temperature materials not normally possible with semiconductor fabrication processes such as high temperature glasses and other materials typically used in incandescent light and arc lamp markets. These materials were developed over the last century to withstand not only the high flux levels created by these sources but also to meet the environmental requirements of everyday use. Low cost manufacturing processes for solid state lighting (SSL) have been sought with only limited success by utilizing organic low temperature materials which can withstand both the flux levels and environmental requirements of lighting. However, the low temperature processing requirement has limited the use of inorganic materials which form robust hermetic seals against the environment. Organic light emitting diodes were sought to be a low cost method of fabricating solid-state lighting. However, the organic materials have not held up to the operating and environmental conditions required in their use.

The intent of this invention is to disclose methods, materials, and applications in which high temperature processes and materials can be used to make devices for lighting, displays, solar cells, and electronics, which overcome the deficiencies, that organic and low temperature materials exhibit. The large area freestanding epitaxial layer disclosed is compatible with thick film materials and processes up to 700 degrees C. in air and higher in controlled atmospheres. This high temperature processing allows for more robust designs and also enables the construction of volume emitters and absorbers for lighting and solar cell applications.

Many applications experience high power densities. Whether a semiconducting device is generating the heat load or exposed to the heat load (i.e. concentrator solar cells), the materials used in the device must be able to withstand the operating conditions of the device. An example of this issue is the power LED. LEDs were initially restricted to low power applications like cell phones and indicators. As output levels have increased, the organic binders, adhesives, and encapsulants used in the past can no longer survive the operating conditions of the devices. The need therefore exists for methods, materials, and articles, which can withstand the high operating conditions, encountered in these new applications.

In addition, semiconducting devices, which experience high power densities, must provide a low thermal impedance path to the cooling means. Freestanding epitaxial chips offer the lowest thermal impedance path possible by eliminating unnecessary thermal boundary interfaces. Large area epitaxial chips are disclosed based on laser lifted gallium nitride layers. These freestanding epitaxial chips typically are greater than 20 microns thick and have an area of more than 1 cm2. These freestanding epitaxial chips are based on HYPE growths on sapphire and provide high crystal quality at low cost.

Freestanding epitaxial chips enable the use of processing temperature in excess of 700 degrees C. This processing temperature enables the use of brazing, welding, frets, low temperature glasses, and other high temperature processes not possible with more conventional fabrication techniques. A multitude of high temperature materials have been developed over the years, which can be used to create a variety of useful devices. In many cases, very simple devices interconnects are required as in LEDs, laser diodes, and power devices.

Unlike semiconductor processing of microprocessors, which require complex interconnects, a significant number of high resolution masking steps and vacuum processes, many simpler devices can be created using printing techniques for lower cost. However, high electrical conductivity materials typically require high processing temperatures to be robust. This invention discloses methods and articles that provide for low cost manufacture of high performance LEDs, power devices and solar cells, which can meet the requirements of high powered operation.

SUMMARY OF THE INVENTION

This disclosure relates to the use of high temperature processing and materials in semiconductor device fabrication. This approach is enabled by the use of freestanding epitaxial chips, which do not require additional supporting substrates. Freestanding epitaxial chips can be created using a variety of techniques including, but not limited to, laser liftoff, chemical liftoff, and mechanical release using a weak boundary layer.

More preferably the freestanding epitaxial chips can be created by the use of laser liftoff nitrides based on HVPE.

These freestanding epitaxial chips are preferably greater than 20 microns thick and have an area greater than 1 cm2. Most preferably, freestanding epitaxial chips are greater than 30 microns thick with an area greater than 1 square inch. The use of high temperature semiconducting materials in a freestanding form enables the use of high temperature interconnect and bonding materials. Most preferably the use of high temperature semiconducting materials enables the use of process materials, which cure, fire, braze, or melt at temperatures greater than 400 degrees C. These process materials include, but are not limited to, brazing alloys, laser welding, high-temperature ceramics and glasses. Most preferably, the process materials include the use of high temperature interconnect methods and materials as developed for the arc lamp industry with freestanding nitride based epitaxial chips.

The use of high temperature interconnect and bonding materials can additionally exhibit an index of refraction intermediate to that of the freestanding epitaxial chip and its surrounding matrix. Most preferably, high index, low melting point glasses provide a hermetic seal of the device but also index match the freestanding epitaxial chip thereby increasing extraction efficiency. In this manner, a variety of organic free semiconducting devices can be created which exhibit superior life, efficiency, and environmental stability. Most preferably, this approach can create solid-state lighting sources.

DETAILED DESCRIPTION OF THE INVENTION

Figure 1:
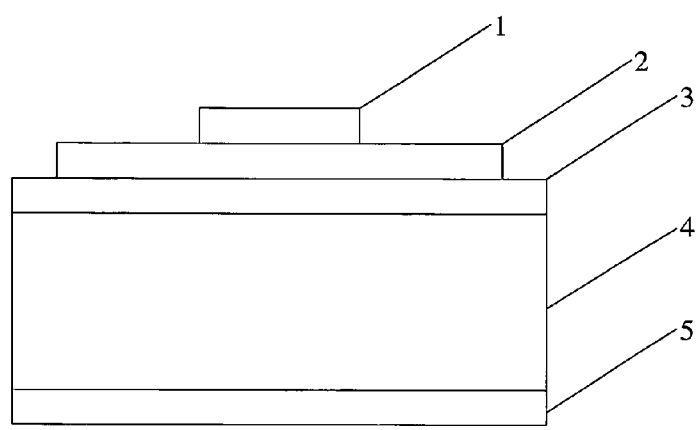
FIG. 1 depicts a conventional prior art LED structure.

FIG. 1 depicts a conventional prior art LED. Light emitting diode 2 is typically less than 5 microns thick. The LED 2 is wafer bonded to support substrate 4 using low temperature solder 3. Low temperature solder 3 typically has between a 300 and 450 degrees C. melt point. Top interconnect 1 is typically vacuum evaporatively coated onto light emitting diode 2. Bottom contact 5 typically is made using an even lower temperature solder than low temperature solder 3. These multiple solder joints rule out the use of high temperature interconnect and encapsulation processes. They also increase the thermal impedance of the device due to multiple thermal interface boundaries.

Figure 2A:
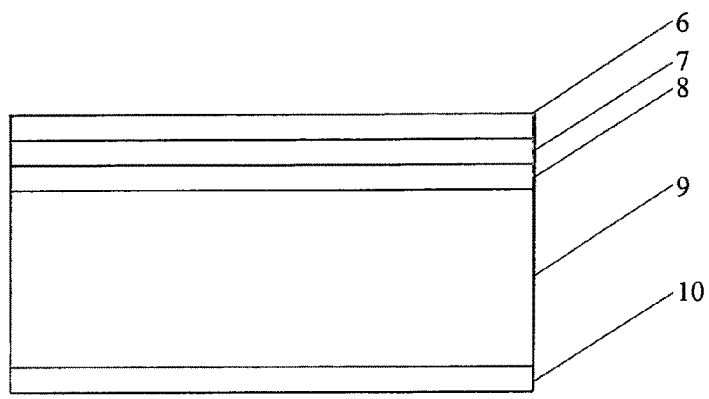
FIGS. 2A and 2B depict a freestanding epitaxial chip of the present invention.

While light emitting diode 2 can be left on or transferred to a transparent substrate, such as sapphire, the thermal impedance will still be higher than a single layer freestanding nitride epitaxial chip. Also, the lack of access to the backside of the light emitting diode 2, in the case where the sapphire growth substrate is still attached, also limits interconnect access and the ability to stack chips. The intent of this invention is to provide means, whereby high temperature materials can be used for improved reliability, efficiency, and life, based on freestanding epitaxial chips which can be stacked, fused, melt bonded, brazed, welded and fired at temperatures greater than 400 degrees C., FIG. 2A depicts a freestanding epitaxial chip of the present invention. Preferably, the freestanding epitaxial chip exhibits an overall thickness greater than 10 microns thick. A freestanding epitaxial chip has a semiconducting layer 9, which may consist of a doped semiconductor. Most preferably, semiconducting layer 9 is at least 10 microns thick, grown via HVPE and is a nitride or nitride alloy consisting of, but not limited to, AlGaN, InGaN, AlInN, AlInGaN, and dilute nitrides. Even more preferably, semiconducting layer 9 exhibits an alpha less than 1 cm (−1) over the emitting region of the device.

HVPE growths can be economically made which exhibit low enough alpha to allow for the use of thick epitaxial layers. HVPE layers greater than 20 microns thick have been demonstrated which are crack free and exhibit sufficient mechanical integrity to be removed from a growth substrate via a variety of methods including but not limited to laser liftoff, chemical etching, and weak boundary release layers. Prior art techniques such as MOCVD do not provide for an economical means of forming thick layers (due to slow growth rates) and tend to have higher alpha (absorption coefficient) due to carbon incorporation. Other prior techniques to form self supporting epitaxial substrates such as incorporating an epitaxial layer on silicon carbide introduce high absorption losses in the operation of the LED. However the use of alternate growth substrates including, but not limited to silicon, silicon carbide, and ZnO, to form the freestanding nitride foils are also possible for use in this invention.

Active layer 8 consists of, but is not limited to, a multiple quantum well MQW, single quantum well SQW, double hetero junction DHJ, single hetero junction SHJ, and PN junction. Both emitting and absorbing devices such as, but not limited to, LEDS, solar cells, laser diodes, VCSELS, and EELEDs are disclosed. These freestanding epitaxial chips can be cleaved. The freestanding nature of this invention makes it suited for applications which require cleaved edges, such as EELED and laser diodes. The thick freestanding nature of this invention enables the use of laser and mechanical scribing on the side opposite active layer 8, such that a clean cleave can be accomplished across active layer 8. Second semiconducting layer 7 may be formed via MOCVD, MBE, HVPE, and other epitaxial means as known in the art. Most preferably, semiconducting layer 7 exhibits an alpha less than 1 cm (−1). Low alpha enables a thick nitride layer that is required for a freestanding substrate without absorption losses caused by the thicker layer. Most preferably, semiconducting layer 7 is formed via HVPE or HOVPE enabling lower alpha and higher crystal quality provided by these growth methods. The use of barrier layers within semiconducting layer 7 as known in the art enhances device performance. The use of HVPE and HOVPE for semiconducting layer 7, even if active layer 8 is formed via MOCVD is an embodiment of this invention. HVPE and HOVPE create higher quality material and their growth rates are 1 to 2 orders magnitude higher than MOCVD and therefore greatly reduce device costs. In general, a preferred embodiment of this approach is to form freestanding epitaxial chips by harvesting greater than 20 micron thick HVPE semiconducting layer 7 from a growth substrate in the form of freestanding foils and then growing in a separate step and/or reactor the active layer 8 and semiconducting layer 7. In this manner bow can be eliminated and higher quality devices can be formed on one or both sides of the freestanding foils. Bow and warpage is caused in conventional nitride processing due to the use of non-native growth substrates having a different thermal expansion coefficient than the nitride layer. By first lifting off the freestanding nitride layer before growing the active layer 8 and semiconducting layer 7 bow and warpage are eliminated during processing allowing for much more precise processing.

Typically, semiconducting layer 9 is an n doped layer and semiconducting layer 7 is a p doped layer. Resistivity of less than 0.5 ohm cm is preferred for n doped material. Transparent conductive layers 6 and 10 are used to form ohmic contact to semiconducting layer 7 and 9. Preferably, degenerative transparent conductive layers are used to form ohmic contact to semiconducting layer 7 and 9. More preferably, epitaxially grown aluminum doped zinc oxide are used for either/or transparent conductive layers 6 and/or 10. The use of epitaxial, evaporative, sputtered, or other growth means on both sides of a freestanding nitride foil is a preferred embodiment of this invention. Even more preferably, the use of epitaxially grown aluminum doped zinc oxide with a thickness greater than 5000 angstroms is disclosed. The thicker layer has been discovered to reduce ESD susceptibility, enable laser welding as well as other high temperature processes, incorporate luminescent species, and also reduce Vf characteristics. Typical aluminum dopant levels are in the range of $10(20)\,cm(-3)$. In addition, by using MOCVD growth of ZnO on thick HVPE nitrides, improved optical characteristics are realized as well as improved electrical characteristics. Typical resistivities of less than $5\times10(-4)$ ohm cm have been realized and forward voltage Vfs less than 2.2 volts have been measured on green and yellow LED structures. Ohmic contacts can be formed very easily using this approach.

In one embodiment, the semiconducting layer 9 is grown to a thickness greater than 10 microns on a sapphire wafer. An active layer 8 is grown via MOCVD or other appropriate epitaxial growth method on the semiconducting layer 9. A semiconducting layer 7 is then grown on the active layer 8. A transparent conductive layer 6 is then grown on the semiconducting layer 7. At this point, a separation method including, but not limited to, mechanical fracture, chemical etching, or laser liftoff as previously disclosed by the inventors to remove layers 6, 7, 8, and 9 from the sapphire wafer. Alternate growth substrates include, but are not limited to AlN, SiC, Si, and ZnO. This growth substrate is typically 1 cm×1 cm or larger depending on the overall thickness of the layers and quality of the crystal growth process. Freestanding epitaxial chips with thickness greater than 30 micron and areas greater than 1 inch square are a preferred embodiment of this invention. Even more preferably, semiconducting layer 9 is grown 10 microns thick on a growth substrate including but not limited to sapphire, silicon, SiC, and removed to form a freestanding foil. Semiconducting layer 9 may be removed from growth substrate using but not limited to laser liftoff, chemical means, photochemical means, and weak mechanical layer. Semiconducting layer 9 may be doped, undoped, semi-insulating, p type, n type, and polar, semi-polar, and non-polar crystal orientation. MOCVD, MBE, HYPE and HOVPE can form layers 8 and 7 and optionally, 6 and 10.

In this case, the freestanding epitaxial chips typically exhibit a uniaxial bow due to stresses created during growth. The thickness of the chips and their flexibility provide means whereby the stresses can be relaxed during processing or relaxed subsequent to processing. By either prestressing in conformable mounts or in mounts that are fitted to the bowed epitaxial chip the stress can be relaxed or eliminated during processing. This novel technique can be used in multiple processes and is an embodiment of this invention. In particular, the bowed chip can be mounted in a spring mount or act as its own spring to secure itself during processing within a rotational reactor such as, but not limited to a MOCVD, MBE, or HYPE reactor. At this point, a large area freestanding epitaxial chip is formed. Because the freestanding epitaxial chip is substantially all nitride in nature, high temperature processes can be used.

Because there are no solders or bonding materials necessary with this approach, a wide range of further processing is possible. The resulting large area freestanding epitaxial chips can be handled, patterned, coated, and stacked together. Alternately, transparent conductive layer 10 can be grown on the large area freestanding epitaxial chip. Again, because there are no low temperature solders or bonding elements utilized, high temperature epitaxial growth methods such as, but not limited to MOCVD, HYPE, hydrothermal, and MBE, can be used. The ability to form thick transparent conductive layers 6 and 10 using these high temperature growth methods on high quality HYPE nitride layers contributes to the low forward voltage Vf levels attained and measured. In this manner, higher efficiency devices for light emission and solar applications can be realized.

Alternately, transparent conductive layers 6 and 10 can be grown at the same time on a large area freestanding epitaxial chip using hot wall reactor approaches. In this approach, the entire surface of the large area freestanding epitaxial chip is coated. Isolation is done when the large area freestanding epitaxial chips are broken down into smaller chips. In addition, a high temperature fusible conductive paste with or without reactive elements can be used to form opaque or patterned ohmic contacts on the large area freestanding epitaxial chips with or without transparent conductive oxide layer 6 and 10. These pastes can be applied to one or both sides as required.

Figure 2B:
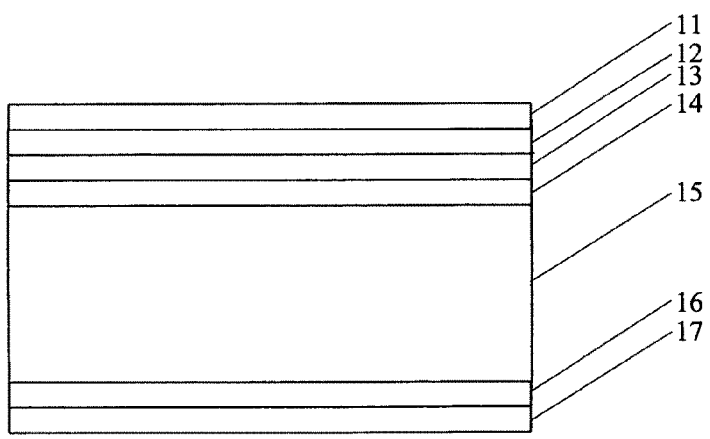

As depicted in FIG. 2B, opaque conductive layers 11 and 17 are applied to the large area freestanding epitaxial chip. Conductive layers 11 and 17 may consist of metal containing glasses, frits, and adhesives. More preferably, conductive layers 11 and 17 consist of silver filled frits with firing temperatures greater than 400 degrees C. The inclusion of reactive elements within conductive layers 11 and 17 enhances ohmic contact and enhances adhesion to n type, p type, and degenerative semiconducting layers. The higher temperature nature of these materials can be used to lead to improved reliability, operating range, and life. Even more preferably, the conductive layers 11 and 17 can have reflectivity greater than 40%. This high reflectivity is especially important in the case of recycling optical structures like LEDs and solar cells where efficiency improvements can be realized by recycling light to active regions or other LEDs or solar cells. The stability and low optical absorption of glasses and frits also are an important aspect of this invention. Unlike organic encapsulants and binders, frits and glasses are very resistant to solarization and environmental degradation. In addition, frits and glasses exist which more closely match the refractive index of the semiconducting and transparent conductive layers used within the large area freestanding epitaxial chips of the present invention. Efficiency and light extraction are enhanced using these index matching layers. The conductive layers 11 and 17 may cover all or part of the large area freestanding epitaxial chip.

Screening printing, ink jet printing, as well as other low cost printing processes can be used to form the conductive layers 11 and 17.

As stated earlier, the thickness of the various layers are critical to the overall device performance. Semiconducting layer 15 is preferred to be greater than 10 micron in thickness. Conversely, this thickness should be less than 250 microns due to cost of the layer and due to optical, thermal, and electrical efficiency losses. Optically, absorption losses increase with increasing thickness. As such, an alpha of less than 1 cm (−1) and a thickness of less than 250 microns are preferred. Also, if the thickness is greater than 250 microns, the thermal impedance of the devices increases. More preferably, a large area freestanding epitaxial chip has a thickness less than 250 microns and a thermal conductivity greater than 120 w/m/k. Lastly, electrically, the device performance suffers when the layers are too thick. Typically, n doped nitrides exhibit resistivities on the order of 0.05 ohm cm for dopant levels of 10 (18) cm−3. For vertical devices with thicknesses greater than 250 microns, series resistance can become an issue. Preferably, a large area freestanding epitaxial chip has a thickness less than 250 microns and resistivity less than 0.05 ohm cm. Even more preferably, a large area freestanding epitaxial chips has a thickness less than 250 microns, a resistivity less than 0.05 ohm cm, an alpha less than 1 cm (−1), and thermal conductivity greater than 120 W/m/k. The additional transparent conductive layers 12 and 16 have alphas less than 1 cm (−1) and thermal conductivity greater than 100 w/m/k.

Surface texturing of any of the layers can enhance light extraction from the large area freestanding epitaxial chip either via laser etching, chemical etching, photochemical etching, mechanical means, or other methods known in the art. Additional layers or features, including but not limited to, wire grid polarizers, dichroic films, luminescent layers (amorphous, single crystalline, ceramic, and polycrystalline), and photonic crystal structures as well as other subwavelength features can be formed on the epitaxial chip of this invention.

Figure 3A:
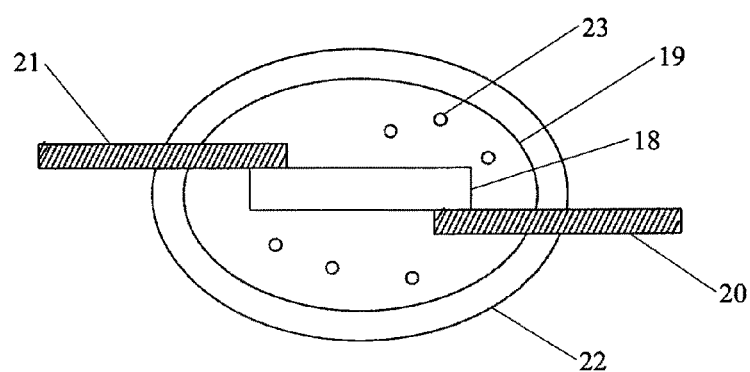
FIGS. 3A and 3B depict a freestanding epitaxial chip embedded within a low temperature glass matrix of the present invention.

FIG. 3A depicts a large area freestanding epitaxial chip 18 embedded in a glass matrix 19. The high temperature nature of large area freestanding epitaxial chip 18 enables the use of a wide variety of glasses and frits. Typically, glasses and frits require temperature greater than 400 degrees C. to melt. These may be fused to large area freestanding epitaxial chips at temperatures greater than 400 degrees C. More preferably, the use of halide glasses with high refractive index can fuse to large area freestanding epitaxial chips at temperatures greater than 400 degrees C. Even more preferably, these high index glasses can hermetically seal the large area freestanding epitaxial chip 18 and/or form an extraction envelope. The ideal LED structure for extraction is a spherical element with an isotropic emitter at its center. This LED structure can be approximated by FIG. 3A. In this case, the index of refraction of the glass matrix 19, its thermal conductivity and its shape all represent important parameters for device performance.

Alternately, a similar argument can be made for solar cell design with regard to coupling into solid concentrators. In this case, maximum coupling of the solar incident light is required. As such, the glass matrix has a thermal conductivity greater than 1 w/m/k and a refractive index greater than 1.6 for the emitted or incident light. Further still, surface texturing and shapes of the glass matrix 19 as known in the art can enhance light extraction or coupling to the large area freestanding epitaxial chip 18.

Embedded elements 23 can be incorporated into the glass matrix 19. These embedded elements 23 may include, but are not limited to, luminescent materials (powdered phosphors, single crystal pieces, ceramic phosphors shapes, and quantum dots), scattering elements (opaque, non-opaque, and directional), polarization defining, and dichroic elements. Shear, magnetic, electrostatic, and other applied force means can orient embedded elements 23.

Electrical contacts 20 and 21 provide electrical interconnect to the large area freestanding epitaxial chip 18 through glass matrix 19. Metals are used which are compatible with glass sealing. More preferably, highly reflective metals for electrical contacts 20 and 21 with reflectivity greater than 40% are used.

Figure 3B:
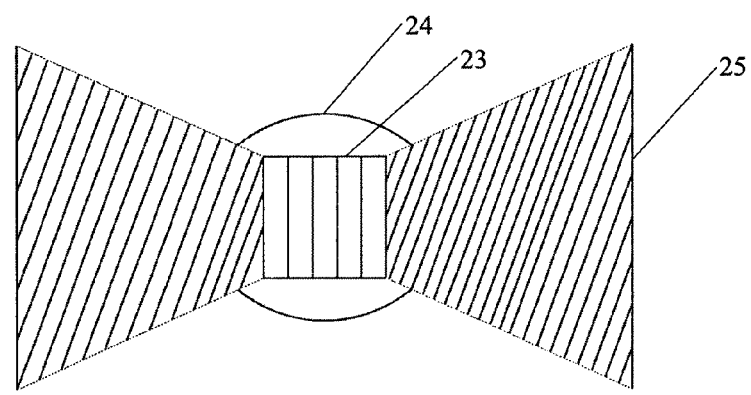

FIG. 3B depicts an alternate form of at least one embedded large area epitaxial chip 23. Because of the freestanding nature of the at least one embedded large area epitaxial chip 23, multiple chips can be stacked. This stacking is also enabled by the transparent conductive layers described earlier, which allows for ohmic contact via physical contact. In addition, coating 22 may be added to enhance efficiency by recycling excitation light back to luminescent embedded elements 23 and/or provide a reflective or absorptive filter in the case of the use of UV LEDS to prevent eye damage. In FIG. 3B, multiple chips are stacked such that an emitting volume is formed. The low absorption and ability of the light to scatter throughout the volume enables the formation of an efficient emitting volume. This volume can have just a few active layers or many active layers. As such, an emitting volume based on stacks of large area freestanding epitaxial chips can be formed. Light extraction is also determined by the surrounding matrix of an encapsulating glass matrix 24. Embedded elements, coatings, and reflective layers as discussed in FIG. 3A are included in this embodiment as well.

Electrical contact 25 provides both thermal, optical and electrical functionality for the device. Thermally, heat generated within the at least one embedded large area epitaxial chips 23 can be conducted out of the device. In addition, the use of reflective surfaces and shapes on electrical contact 25 can be used to impart directionality to the optical output of the device.

Lastly, power input to the at least one embedded large area epitaxial chip 23 is disclosed. Using this design, very high lumens per etendue sources can be created for use in directional lighting, projection, and machine vision applications. In particular, this approach can be used to make an arc lamp replacement bulb. The at least one embedded large area epitaxial chips 23 can have different emission wavelengths, graded wavelengths, and external and/or stacked wavelength conversion layers.

Wavelength conversion layers can be intrinsically electrically conductive as in the case of ZnO based luminescent materials and/or contain an electrical feedthru. Single crystal and/or ceramic phosphor materials exhibit thermal conductivity greater than 1 w/m/k. In addition to the enhanced lumen per etendue that this approach enables, enhanced current spreading is possible based on the ability to form two full area surface contacts and still have light extraction. The geometry of a stacked volume emitter allows for unique optical and electrical characteristics. As such, the formation of a volume emitter has the majority of the emission occurring normal to the electrical input to the device. This can enhance extraction efficiency since the recombination active area is located completely under the electrical contacts.

Figure 4A:
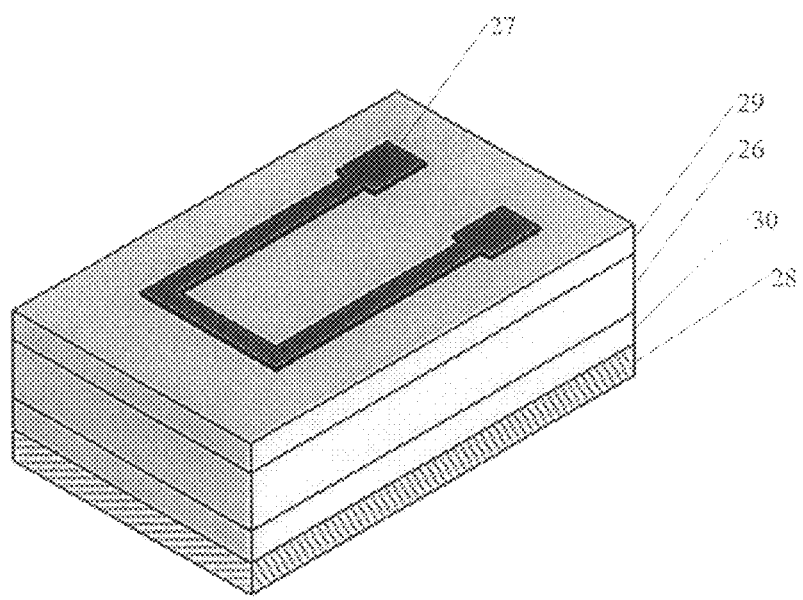
FIGS. 4A and 4B depict a freestanding epitaxial chip with high temperature silver contacts of the present invention.

Additionally, the use of the glass matrix 24 enhances light extraction from the emitting volume formed by stacking multiple embedded large area epitaxial chips 23. It is again emphasized that the ability to use high temperature materials like glasses and fits is critical to enable these devices due to the high flux levels generated. Unlike conventional LED packaging and more particularly OLEDs in which organics are intrinsic to the design, this present invention does not depend on organic materials, which are inherently unreliable in these high flux applications. Similar benefits are also valid for solar applications especially in concentrator applications where high flux levels and high temperatures are encountered FIG. 4A depicts the use of thick film conductive contacts 27 on large area freestanding epitaxial chips 26. Preferably, high temperature, printable conductive materials are used as thick film conductive contacts. More preferably, fusible printable conductive materials with processing temperatures greater than 400 degrees C. are used as thick film conductive contacts. The use of these materials is enabled by the large area freestanding epitaxial chip 26, due to the absence of any low temperature bonding or organic layers typically required in conventional nitride device fabrication. Also, the removal of any growth substrate, such as a sapphire wafer, enables the processing of both sides of the large area freestanding epitaxial chips 26. Additionally, reactive elements as used in silicon solar thick film conductive layer processing can form ohmic contacts to n doped, p doped, and degenerative nitrides and oxides like ZnO. Preferably, thick film printable conductive materials that exhibit reflectivity greater than 40% are used. More preferably thick film printable conductive materials exhibiting reflectivity greater than 50% are used. And even more preferably thick film printable conductive materials exhibiting reflectivity greater than 60% are used. This high reflectivity is especially important in applications in which light recycling is used such as in LED and solar cell applications.

Critical to this approach is the thickness and quality of the at least one degenerative semiconductor layers 29 and 30. This is due to the need for sufficient thickness to prevent diffusional effects and stresses induced during high temperature processing. It has been demonstrated that a wide variety of high temperature processes can be used if the at least one degenerative semiconductor layers 29 and 30 have sufficient thickness. These high temperature processes include, but are not limited to, laser welding, brazing, fitting, and fusion bonding. In particular, direct laser welding of metal ribbons to both the nitride and oxide layers described herein via laser welding using IR lasers has been successfully demonstrated. As such, at least one degenerative layer 29 and 30 exhibits a thickness greater than 5000 Angstroms. Even more preferably, MOCVD grown aluminum doped ZnO has a thickness greater than 1 micron. Even further, the use of MOCVD grown aluminum doped ZnO degenerative semiconductor layers increases the mechanical strength of the nitride layer 26, which enables larger area devices. This is due in part to the formation of an outer skin, which has different cleavage planes relative to the underlying nitride layer 26 and also due to formation of outer stress skin, which creates a mechanically stronger chip. Further still, the MOCVD grown aluminum doped ZnO has a dopant concentration greater than 10 (20) cm (−3) and a thickness greater than 5000 Angstrom to enhance current spreading.

The growth of at least one degenerative layer 29 and 30 on at least one large area epitaxial chip made from a HVPE layer exhibits a dislocation density less than $10^8$ cm$^{-2}$. As a nitride as grown thicker the dislocation density decreases. Preferably, the freestanding nitride epitaxial chip has a thickness greater than 30 microns. For thicknesses greater than 30 microns, large area epitaxial chips with areas greater than 1 square centimeter 2 can be handled.

These large area epitaxial chips can be handled and processed using printing techniques such as but not limited to screen-printing, inkjet printing, transfer printing, and other techniques as known in the art. Curing methods for these large area epitaxial chips include flash firing, electron beam curing, and other thermal firing processes as known in the art. In the case of Lambertian emitters, the back contact 28 may cover one entire face of the device.

Figure 4B:
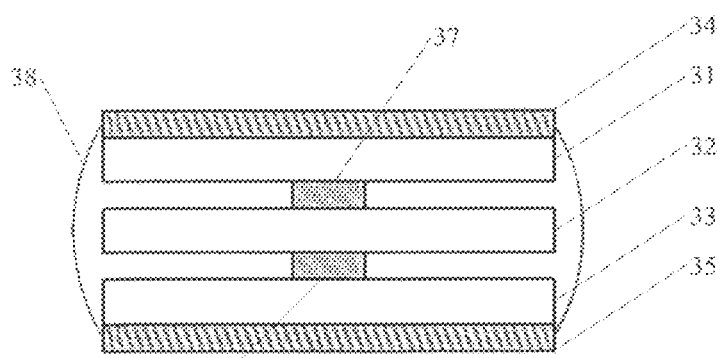

FIG. 4B depicts the use of thick film high temperature conductive contacts 37 and 36 between stacked large area epitaxial chips 31, 32, and 33. The resulting volume emitter is surrounded by a glass matrix 38, as discussed previously. Embedded elements are within the glass matrix 38 as previously disclosed.

Alternately, this configuration creates an enhanced solar cell. In this case, the glass matrix 38 would be configured to couple solar energy into the absorbing volume created by the stacked array of large area epitaxial chips 31, 32, and 33. By coupling into the absorbing volume in this manner, the absorption cross-section is greatly increased. In conventional solar designs, incident light must be strongly absorbed in the first initial pass through the device. While a rear reflector and surface feature can be used to capture some of the unabsorbed light, the majority of the absorption must be done in the first pass to create an efficient device.

For nitrides, this is especially difficult due to problems with growing high quality thick layers of high indium content InGaN. While alloys of indium, gallium and nitrogen span the entire solar spectrum from 3.2 to 0.7 eV, the formation of high indium content high crystalline quality alloys have been limited. The use of HVPE templates creates high indium content alloys, which overcome some of these limitations, but the thickness of these layers is still somewhat limited. By forming an absorbing volume as described in FIG. 4B, the optical path length through the absorbing layer of the solar cell of the incident light can be increased and large area freestanding epitaxial chips 31, 32, and 33 can be made with different spectral responses for improved efficiency.

While stacked solar cells have been demonstrated, incident light enters normal to the device. In this case, incident light is edge coupled at multiple opportunities for absorption and conversion to electricity are created by the device structure. This enables the use of thin high quality layers with lower indium content due to large absorption cross-section. The glass matrix 38 may be shaped into a variety of concentrator elements to further enhance the coupling of incident light into the absorbing volume including but not limited to non-imaging, recycling, and imaging optical elements. The addition of reflective, dichroic, and anti-reflective layers either on or adjacent to the glass matrix 38 enhances the coupling into the absorbing volume. Most preferred, the use of glass matrix 38 substantially index matches to the absorbing volume.

Figure 5:
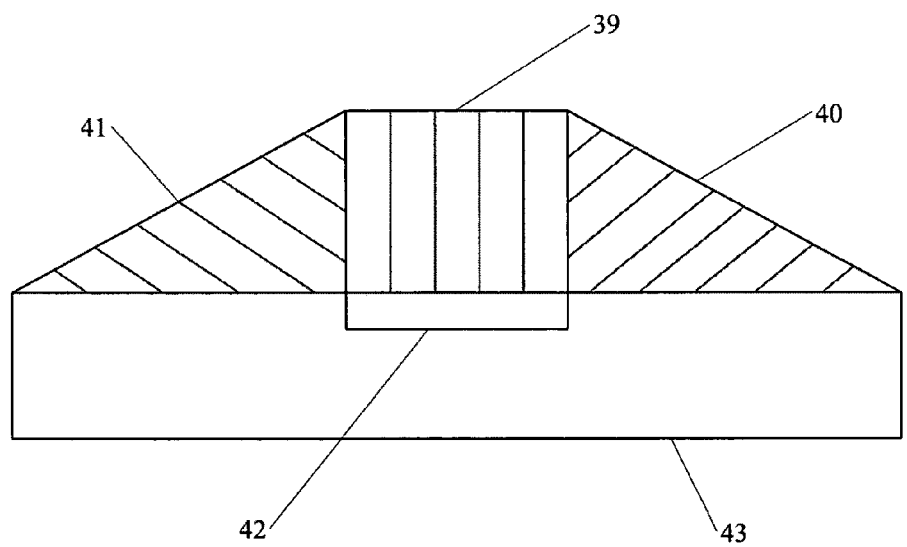
FIG. 5 depicts at least one epitaxial chip with a larger side area that top area forming an emitting or absorbing volume of the present invention.

FIG. 5 depicts an emitting or absorbing volume based on at least one epitaxial chip 39. The at least one epitaxial chip 39 or stack are electrically and thermally connected via interconnects 41 and 40 to substrate 43. The inclusion of a reflector 42 enhances emission or absorption within the emitting or absorbing volume. In this configuration, the formation of the physical connection between the at least one epitaxial chip 39 and others in the stack (both electrical and thermal) is established by the transparent conductive layers previously disclosed.

Also disclosed is the wafer bonding of the at least one epitaxial chips 39 to form the stacked volume described. As known in the art, direct bonding is possible based on pressure and heat. The use of solvent enhances bonding. Also, the use of high temperature conductive contacts between the at least one epitaxial chips 39 as described in FIG. 4B is also an embodiment. In this configuration, emission or absorption is via the three exposed surfaces of the volume versus the four sides, as shown in previous figures. The emission or absorption area is further restricted by adding additional reflectors 42 to form recycling optical cavities. In particular, the formation of an emitting volume creates enhanced radiance sources for projection and other directional light sources. Luminescent layers and/or elements both internal and external to the emitting volume can be included.

Figure 6:
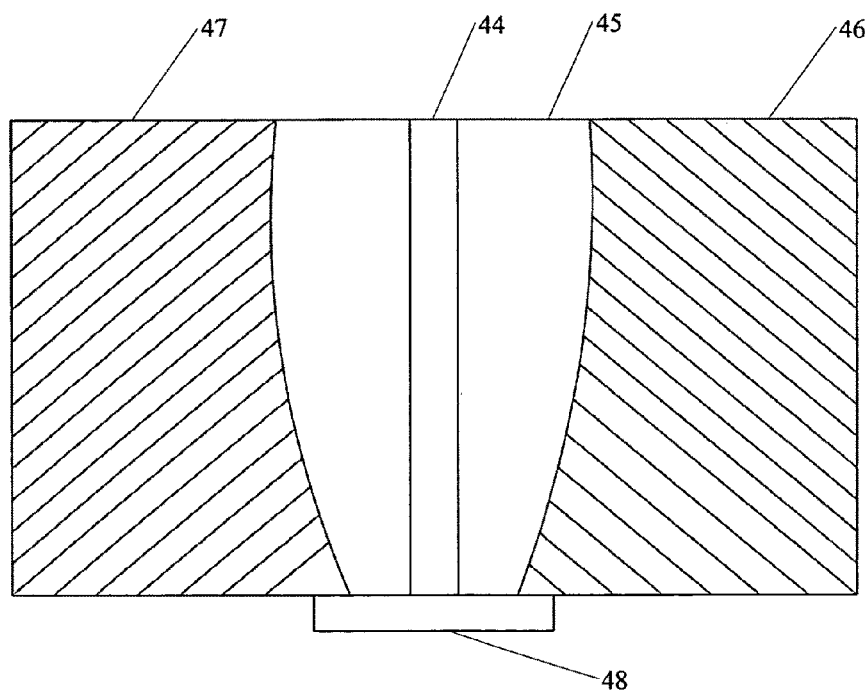
FIG. 6 depicts an epitaxial chips sandwiched between two transparent electrically conductive contacts of the present invention.

FIG. 6 depicts at least one epitaxial chip 44 mounted between substantially optically transparent, electrically conductive elements 45. More preferably, substantially optically transparent, electrically conductive elements 45 are based on doped zinc oxide crystals, doping to include, but not limited to, rare earths, gallium, magnesium, bismuth, zinc, lithium, aluminum, and other dopants known in the art to create luminescent and/or electrical conductivity within zinc oxide alloys. Even more preferred is the use of zinc oxide alloys, which exhibit at least one dopant concentrations greater the $10^{19}$ cm$^{-3}$ (−3). Substantially optically transparent, electrically conductive elements 45 may include but not limited to single crystals, polycrystals, and ceramic materials. Most preferable, are substantially optically transparent, electrically conductive elements 45 which exhibit refractive indexes substantially similar to at least one epitaxial chips 44 to enhance coupling both out of and into the device. Substantially optically transparent, electrically conductive elements 45 are shaped to create directionality or concentration. Contacts 46 and 47 may include reflective surfaces to further enhance directionality or concentration of light into or out of the device. The use of an additional reflector 48 may also be used to enhance device performance.

Figure 7:
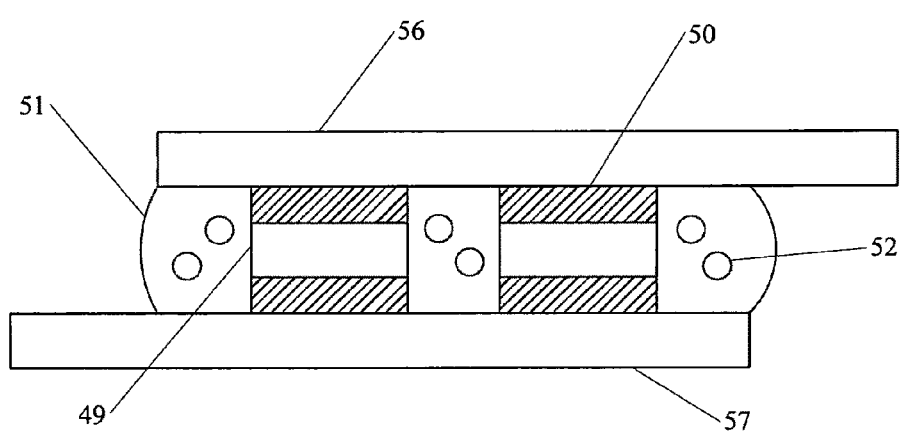
FIG. 7 depicts an array of side emitting epitaxial chips within a high temperature glass matrix of the present invention.

FIG. 7 depicts a side emitting epitaxial chip 49 embedded within a high temperature glass matrix 51. Because the side emitting epitaxial chip 49 as described previously can be further processed at temperatures up to 700 degrees C., a wide range of glasses and frits developed for the lighting industry can be used for glass matrix 51. Unlike conventional LEDs which use low temperature solders or organics, side emitting epitaxial chip 49 can be brazed, melt bonded, direct wafer bonded, and fused into a wide range of glasses, metals, and high temperature composite materials. Because there is not a sapphire or other growth substrate present, both sides of the side emitting epitaxial chip 49 are available for processing. The absence of a substrate along with the large areas available enables the use of low cost printing and coating techniques as discussed previously.

In this configuration, large area freestanding epitaxial chips are coated via dip coating, spray painting, screen printing, and other coating methods known in the art with an opaque high temperature conductive coating such as Solamet (Dupont trademark). These conductive pastes can be flash fired, kiln fired, or radiation cured to form high temperature conductive layers on the large area freestanding epitaxial chips. The use of additional reactive elements within the coatings enhances ohmic contact and/or adhesion to n doped, p doped, and degenerative layers described within the large area freestanding epitaxial chips as disclosed previously. More preferably, high temperature conductive layers capable of withstanding further processing temperature above 400 degrees C. are used. This enables the use of glasses, fits, and other high temperature materials.

By enabling the use of high temperature process, both for the interconnect/contact 50 and side emitting epitaxial chips 49, hermetically sealed devices can be constructed. Alternately, interconnect/contact 50 may be on one or both sides of a transparent conductive layer such that a portion of the light emitted by side emitting epitaxial chip 49 does not couple into the glass matrix 51. In this case, aluminum doped zinc oxide is a preferred embodiment for the conductive layer for all the reasons discussed previously. The partial opaque conductive contacts can be used with or without the transparent conductive layer for interconnect/contact 50. The use of combinations of opaque and transparent layers for interconnect/contact 50 allows for self-assembly due to surface wetting, solderability, and other alignment means.

The need for hermeticity in high flux applications has been learned over the last century by the lighting industry. While many attempts have been made to use organics and low temperature processes in forming LEDs and solar cells including, but not limited to, OLEDs, and silicone encapsulants, life and reliability have always be compromised.

The formation of devices in which all the materials and processes used to form the device are compatible with or occur at temperatures greater than 400 degrees C. is an embodiment of this invention. In this configuration, the large area freestanding epitaxial chip, once coated, is broken down into side emitting epitaxial chip 49 with interconnect/contact 50 using, but not limited to, laser scribing, mechanical scribing, mechanical pressure, or etching means. The side emitting epitaxial chips may be preferentially broken along cleave planes. More preferably, equilateral triangular shapes and/or parallelograms based on these cleave planes can be formed. These shapes are preferred based on ease of formation due to tendency of the large area freestanding epitaxial chips to form these shapes during breakage, but also because it provides for enhanced extraction due to internal reflection within the chip itself.

Once formed, the resulting devices can be encapsulated within the glass matrix 51. Alternately, the use of interconnect means 56 and 57 can be used to connect the devices embedded within the glass matrix 51. Interconnect means 56 and 57 may include, but not limited to metals, conductive transparent crystals, glasses and luminescent layers coated with transparent conductive layers, glasses and luminescent layers coated with opaque conductive layers and/or transparent conductive layers, and active and passive matrix backplanes. The use of this approach selectively addresses the devices within the glass matrix 51 for the formation of information displays.

Further, embedded elements 52 can extract the side emission from the side emitting epitaxial chip 49. The embedded elements may include luminescent materials (powdered phosphors, ceramic phosphor pieces, single crystal phosphor pieces, quantum dots, and composites containing luminescent elements), scattering elements based on air bubbles, transparent materials with different refractive index than the surrounding glass matrix, and opaque materials with a desired reflectivity. The concentration, placement, and type of embedded elements can be modified spatially through the use of printing techniques such that a variety of outputs can be created up to and including the formation of color pixels for display and lighting applications. Because the side emitting epitaxial chip 49 couples into the glass matrix, the majority of the output can be determined by the embedded elements 52. In this manner, UV LEDs can be used to excite luminescent embedded elements 52 which then emit outward through one or both of the interconnect means 56 and 57.

The application of side emitting epitaxial chip 50 with interconnect/contact 50 (opaque, transparent, or a combination of both) along with glass matrix 51 with optionally embedded elements 52 to a surface, as free stand sheet or between two surfaces, and then cured, fired, or melt bonded together simultaneously is a preferred embodiment of this invention. The resulting composite matrix is enabled by the compatibility of all the elements to withstand the processing temperature required.

Figure 8:
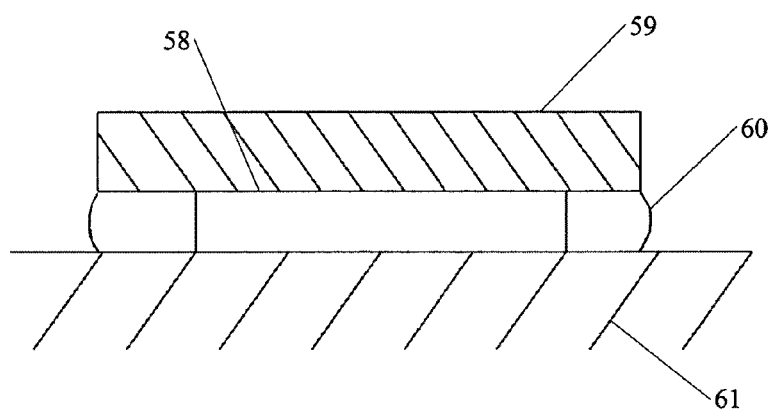
FIG. 8 depicts a power device based on stacked epitaxial chips of the present invention.

FIG. 8 depicts a power device formed by using at least one freestanding large area epitaxial chip 58 sandwiched between two interconnects 59 and 61. More preferably, the power device 58 comprises at least one freestanding large area epitaxial chip 58. This configuration allows for improved thermal design due to reduced thermal interfaces but it also allows for stacking, which creates improved current spreading within the device. Matrix material 60 can provide a hermetic seal and or mechanical bond between interconnects 59 and 61. In addition, matrix material can be used to control shunt resistance across the part.

For the same reasons stated above, the thickness and high temperature capability of the at least one freestanding large area epitaxial chip 58 is critical to the design. While sufficient thickness is required to provide isolation and allow for high temperature bonding (diffusion effects), too thick a layer will impede the thermal performance of the device due to the finite thermal conductivity of the at least one freestanding large area epitaxial chip 58. In many cases, the stacking of multiple thin at least one freestanding large area epitaxial chips 58 will outperform a single device. This configuration is not only applicable to power devices but also high frequency, optoelectronic and other electronic devices in which low inductance impedance is required. More preferably the use of multiple stacked at least one freestanding large area epitaxial chip 58 to create low impedance electronic devices while allowing for low thermal impedance performance is disclosed. Using this approach, very large area devices can be formed and tested prior to final assembly into the package. As such, freestanding large area epitaxial chips allow for formation of testable large area devices. Even more preferred is the formation of large area testable devices, which can be probed from both sides because of the freestanding nature of the epitaxial chip. The flexible nature of the at least one freestanding epitaxial chip 58 as such interconnect 61 and/or 59 does not have to be planar. More preferably at least one of interconnect 61 and 59 are non planar and are at least one heat pipe.

While the invention has been described in conjunction with specific embodiments and examples, it is evident to those skilled in the art that many alternatives, modifications and variations will be apparent in light of the foregoing description. Accordingly, the invention is intended to embrace all such alternatives, modifications and variations as fall within the spirit and scope of the appended claims.

The invention claimed is:

1. A stack of multiple flexible freestanding nitride epitaxial chips comprising:
   at least two freestanding nitride epitaxial chips, each flexible freestanding nitride epitaxial chip having
   at least one freestanding nitride layer having a first side and a second side, said second side being opposite said first side, having a thickness greater than 10 microns and less than 250 microns; and
   at least one semiconducting layer grown on said first side of said at least one freestanding nitride layer.

2. The stack of multiple flexible freestanding nitride epitaxial chip of claim 1 further comprising
   said at least two flexible freestanding nitride epitaxial chips being encapsulated within a glass matrix.

3. The stack of multiple flexible freestanding nitride epitaxial chip of claim 2 wherein said glass matrix having a processing temperature greater than 400 degrees C.

4. The stack of multiple flexible freestanding nitride epitaxial chip of claim 1 further comprising
   said at least two flexible freestanding nitride epitaxial chips being embedded within an inorganic matrix to form an emitting volume.

5. A flexible freestanding nitride epitaxial chip comprising
   at least one freestanding nitride layer thick having a first side and a second side, said second side being opposite said first side;
   at least one semiconducting layer grown on said first side of said at least one freestanding nitride layer; and
   wherein said flexible freestanding nitride epitaxial chip is bowed and forms a spring.

6. A method for forming a semiconductor element comprising:
   growing at least one active semiconductor layer on at least one side of a flexible freestanding nitride foil;
   coating said at least one active semiconductor layer with a TCO;
   electrically isolating the two surfaces of said semiconductor element by removing the outer edges of semiconductor element to form an electrically isolated semiconductor element; and
   segmenting said electrically isolated semiconductor element into smaller semiconductor devices.

* * * * *